United States Patent
Takeuchi et al.

(10) Patent No.: US 10,135,356 B2
(45) Date of Patent: *Nov. 20, 2018

(54) POWER CONVERSION APPARATUS

(71) Applicant: DENSO CORPORATION, Kariya, Aichi-pref. (JP)

(72) Inventors: Kazuya Takeuchi, Kariya (JP); Tetsuya Matsuoka, Kariya (JP); Ryota Tanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/655,027

(22) Filed: Jul. 20, 2017

(65) Prior Publication Data

US 2017/0317605 A1 Nov. 2, 2017

Related U.S. Application Data

(63) Continuation of application No. 15/013,503, filed on Feb. 2, 2016, now Pat. No. 9,735,700.

(30) Foreign Application Priority Data

Feb. 13, 2015 (JP) .................................. 2015-026813

(51) Int. Cl.
*H05K 7/20* (2006.01)
*H02M 7/00* (2006.01)

(52) U.S. Cl.
CPC ........ *H02M 7/003* (2013.01); *H05K 7/20263* (2013.01); *H05K 7/20927* (2013.01)

(58) Field of Classification Search
CPC .......... H05K 7/20927; H05K 7/20263; H02M 7/003
See application file for complete search history.

(56) References Cited

U.S. PATENT DOCUMENTS 3,857,074 A * 12/1974 Heywang ............... H01G 4/228
361/307
6,031,751 A * 2/2000 Janko ..................... F28F 13/00
165/104.33

(Continued)

FOREIGN PATENT DOCUMENTS

JP     2001-352023 A    12/2001
JP     2010-252461 A    11/2010

(Continued)

OTHER PUBLICATIONS

Dec. 19, 2016, Office Action issued in U.S Appl. No. 15/013,503.
May 12, 2017, Notice of Allowance issued in U.S. Appl. No. 15/013,503.

*Primary Examiner* — Hoa C Nguyen
*Assistant Examiner* — Keith Depew
(74) *Attorney, Agent, or Firm* — Oliff PLC

(57) ABSTRACT

A power conversion apparatus includes a capacitor and a heat dissipation member for cooling the capacitor. The capacitor and the heat dissipation member are pressed in an arranging direction in which the capacitor and the heat dissipation member are arranged. The capacitor includes a capacitor element which includes a dielectric body and a metal layer formed on a surface of the dielectric body, an electrode part connected to the metal layer and a bus bar connected to the electrode part. Part of the bus bar is interposed in the arranging direction between the heat dissipation member and the capacitor element.

4 Claims, 14 Drawing Sheets

(56) References Cited

U.S. PATENT DOCUMENTS

| | | | | |
|---|---|---|---|---|
| 7,978,471 B2* | 7/2011 | Tokuyama | ............... | H01L 23/36 165/104.33 |
| 8,432,694 B2* | 4/2013 | Hentschel | ............. | H01L 23/473 165/80.4 |
| 8,599,556 B2* | 12/2013 | Hentschel | ............. | H01L 23/473 361/699 |
| 8,665,623 B2* | 3/2014 | Suzuki | ................. | H02M 7/003 363/141 |
| 8,958,225 B2* | 2/2015 | Ichijo | ...................... | H02M 1/00 363/141 |
| 8,963,322 B2* | 2/2015 | Kiuchi | ................ | H01L 23/4012 257/686 |
| 9,030,822 B2* | 5/2015 | Sharaf | ................ | H05K 7/20927 361/699 |
| 9,419,535 B2* | 8/2016 | Nishihara | ............. | H02M 7/003 |
| 9,439,278 B2* | 9/2016 | Singh | ....................... | H01G 4/32 |
| 9,445,532 B2* | 9/2016 | Chen | ................ | H05K 7/20509 |
| 9,510,487 B2* | 11/2016 | Horiuchi | ................ | H02M 7/003 |
| 2006/0291261 A1* | 12/2006 | Ohnishi | ................ | H02M 7/003 363/141 |
| 2010/0259898 A1* | 10/2010 | Kimura | ................ | H05K 7/209 361/704 |
| 2011/0194247 A1* | 8/2011 | Nakasaka | ........... | H01L 23/4093 361/689 |
| 2011/0194248 A1* | 8/2011 | Nakasaka | ............. | H01L 23/473 361/689 |
| 2011/0194249 A1* | 8/2011 | Nakasaka | ............. | H01L 23/473 361/689 |
| 2011/0194322 A1* | 8/2011 | Nakasaka | ........... | H05K 7/20927 363/141 |
| 2013/0272046 A1* | 10/2013 | Matsuoka | ........... | H02M 7/5387 363/132 |
| 2014/0119087 A1* | 5/2014 | Matsuoka | ............. | H02M 7/003 363/132 |

FOREIGN PATENT DOCUMENTS

| | | |
|---|---|---|
| JP | 2013-084787 A | 5/2013 |
| JP | 2013-197267 A | 9/2013 |
| JP | 2014-161159 A | 9/2014 |
| JP | 2015-012639 A | 1/2015 |

* cited by examiner

POWER CONVERSION APPARATUS

This is a Continuation of application Ser. No. 15/013,503, filed Feb. 2, 2016, which claims priority of Japanese Patent Application No. 2015-026813 filed in Japan on Feb. 13, 2015. The disclosures of the prior applications are hereby incorporated by reference herein in their entirety.

BACKGROUND OF THE INVENTION

1. Field of the Invention

The present invention relates to a power conversion apparatus including a capacitor and a heat dissipation member for cooling the capacitor.

2. Description of Related Art

There is known a power conversion apparatus that includes a capacitor and a heat dissipation member for cooling the capacitor, and performs power conversion between DC power and AC power. For example, refer to Japanese Patent Application Laid-open No. 2001-352023. In this power conversion apparatus, the capacitor and the heat dissipation member are pressed in the direction in which they are arranged by a pressing member such as a flat spring, to ensure a contact pressure between the capacitor and the heat dissipation member for increasing the efficiency of cooling the capacitor.

However, there is still room for improvement in increasing the efficiency of cooling the capacitor in the above conventional power conversion apparatus as explained below. The capacitor includes a capacitor element, an electrode part formed in the capacitor element, and a bus bar connected to the electrode part. The capacitor element includes a dielectric body made of resin or ceramic material, and a metal layer formed on the surface of the dielectric body. When a ripple current flows through the metal layer, heat occurs due to resistance of the metal layer. This power conversion apparatus has a structure in which the capacitor is cooled directly by the heat dissipation member. Accordingly, since the heat occurring in the metal layer is blocked by the dielectric body, it is difficult to transfer the heat to the heat dissipation member efficiently. Hence, this power conversion apparatus has a problem in that it is difficult to sufficiently increase the efficiency of cooling the capacitor element.

SUMMARY

An exemplary embodiment provides a power conversion apparatus including:

a capacitor; and a heat dissipation member for cooling the capacitor;

the capacitor and the heat dissipation member being pressed in an arranging direction in which the capacitor and the heat dissipation member are arranged, the capacitor including a capacitor element which includes a dielectric body and a metal layer formed on a surface of the dielectric body, an electrode part connected to the metal layer and a bus bar connected to the electrode part, part of the bus bar being interposed in the arranging direction between the heat dissipation member and the capacitor element.

According to the exemplary embodiment, there is provided a power conversion apparatus capable of increasing the efficiency of cooling of a capacitor element thereof.

Other advantages and features of the invention will become apparent from the following description including the drawings and claims.

PREFERRED EMBODIMENTS OF THE INVENTION

First Embodiment

Figure 1:
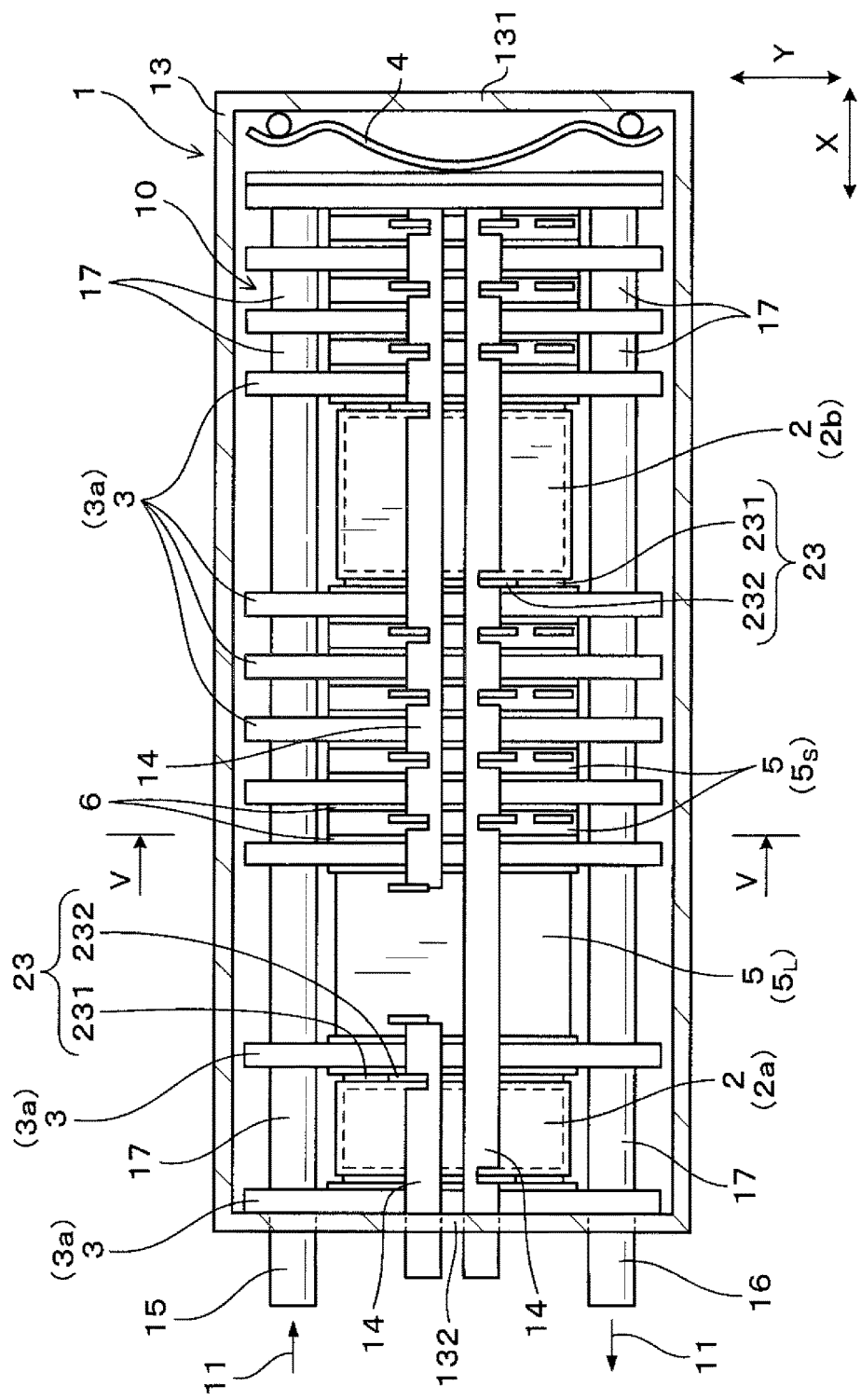
FIG. 1 is a cross-sectional view of a power conversion apparatus according to a first embodiment of the invention, or a cross-sectional view of FIG. 5 taken along line I-I.

A power conversion apparatus 1 according to a first embodiment of the invention is described below with reference to FIGS. 1 to 7. As shown in FIGS. 1 to 4, the power conversion apparatus 1 includes capacitors 2a and 2b (collectively referred to as the capacitor 2 hereinafter) and heat dissipation members 3 for cooling the capacitors 2. The capacitors 2 and the heat dissipation members 3 are pressed in the direction in which they are arranged (X-direction) by a pressing member 4 such as a flat spring.

Figure 2:
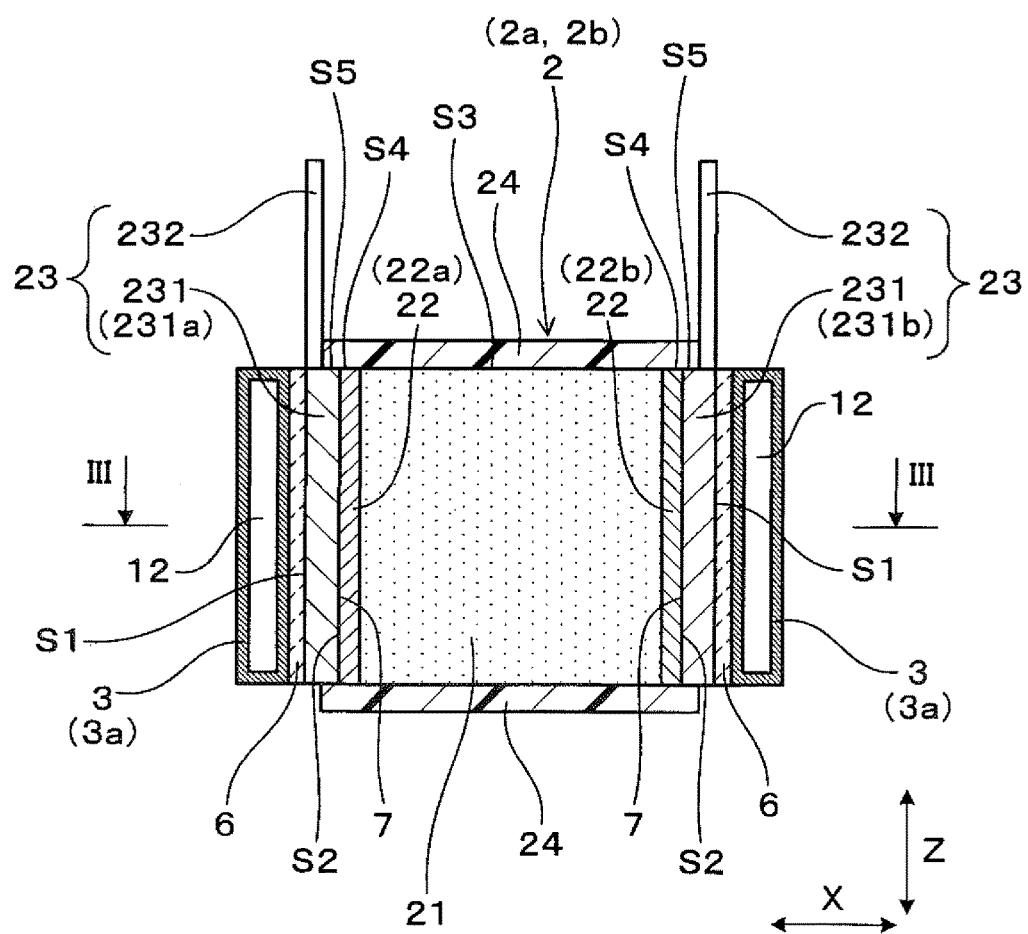
FIG. 2 is a cross-sectional view of capacitors and heat dissipation members of the power conversion apparatus, or a cross-sectional view of FIG. 3 taken along line II-II.
Figure 3:
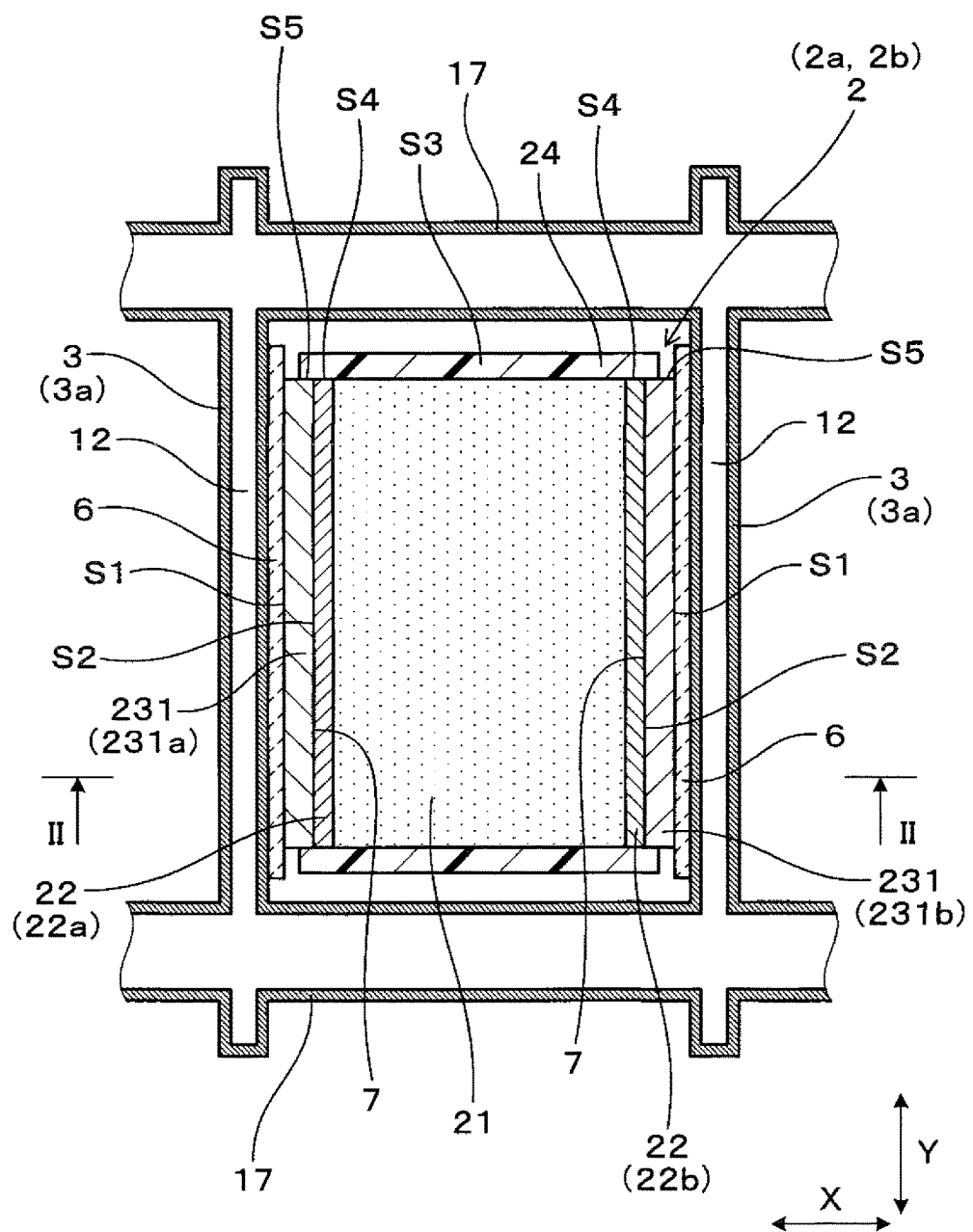
FIG. 3 is a cross-sectional view of FIG. 2 taken along line III-III.
Figure 4:
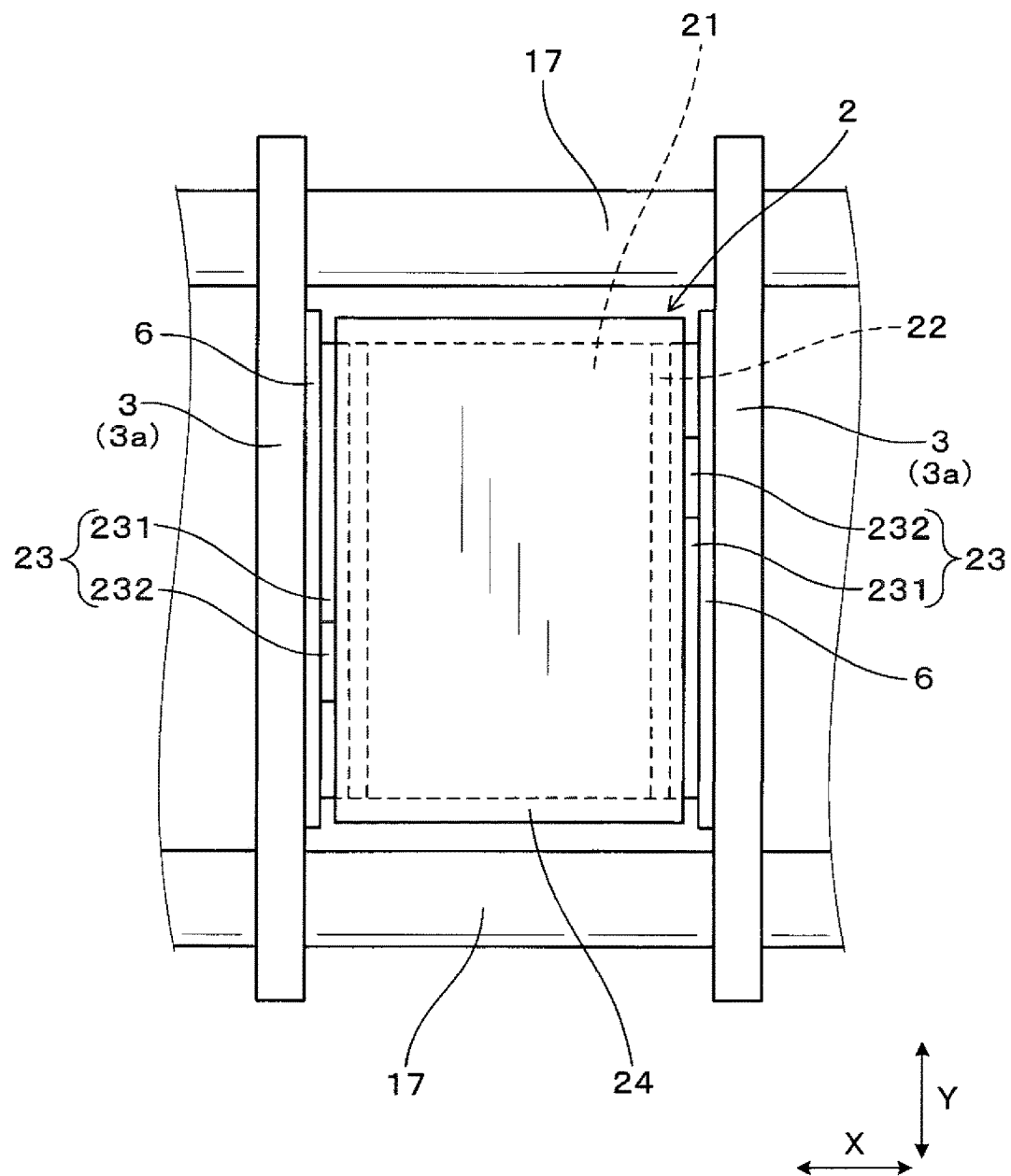
FIG. 4 is a figure viewing from the arrow direction IV of FIG. 2.
Figure 6:
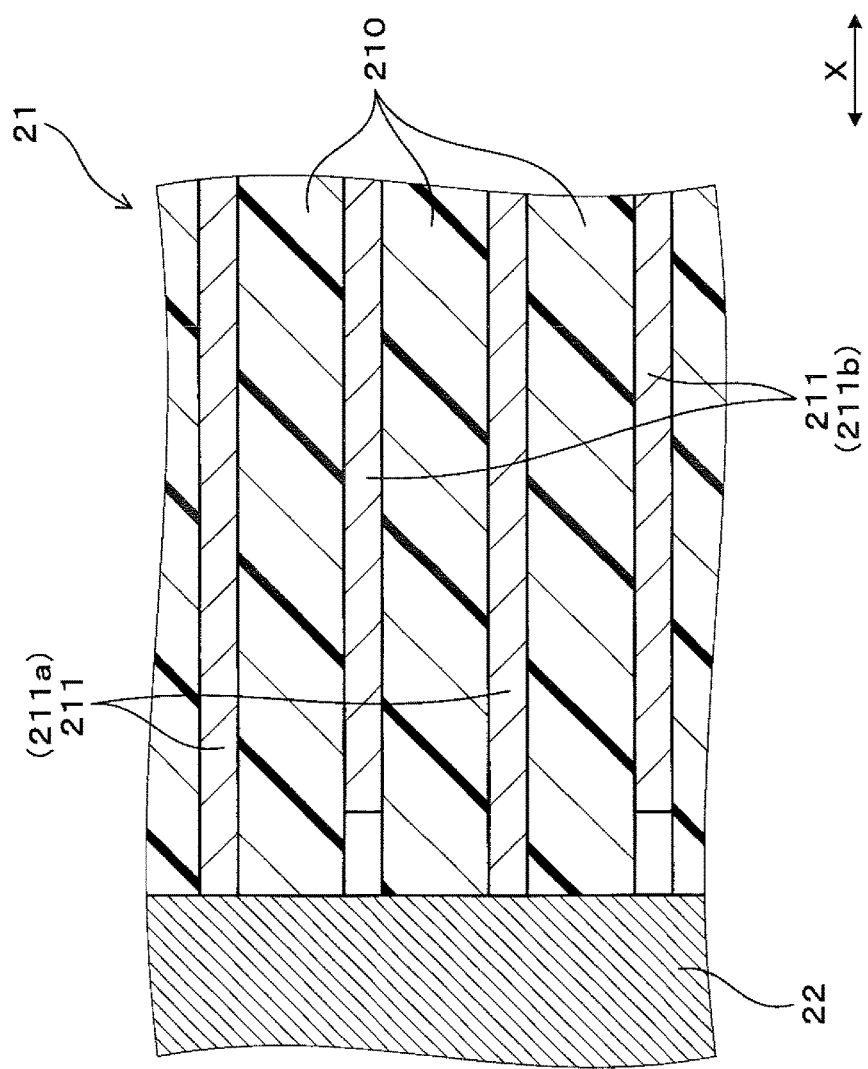
FIG. 6 is an enlarged cross-sectional view of a capacitor element and an electrode part of the capacitor.

As shown in FIGS. 2 and 3, the capacitor 2 includes a capacitor element 21, electrode parts 22 and bus bars 23. As shown in FIG. 6, the capacitor element 21 includes a dielectric body 210 and a metal layer 211 formed on the surface of the dielectric body 210. The electrode parts 22 are connected to the metal layer 211. As shown in FIGS. 2 and 3, the bus bars 23 are connected to the electrode parts 22. Part of each bus bar 23 is interposed between the corresponding heat dissipation member 3 and the capacitor element 21 in the X-direction. A principal surface S1 of this interposed part on the side of the heat dissipation member 3 is flat.

The power conversion apparatus 1 of this embodiment is mounted on an electric vehicle or a hybrid vehicle. The capacitor element 21 is a film capacitor element. As shown in FIG. 6, the capacitor element 21 includes a film made of synthetic resin (dielectric body 210) and the metal layer 211 formed on the surface of this film wound in a coil. The metal layer 211 includes a first metal layer 211a connected to the first electrode 22a and a second electrode layer 211b connected to the electrode part 22b (see FIG. 2). The electrode part 22 is a metalicon electrode.

As shown in FIG. 1, the power conversion apparatus 1 includes two capacitors: the filter capacitor 2a and the smoothing capacitor 2b.

As shown in FIGS. 2 and 3, each bus bar 23 includes a connection part 231 connected to the electrode part 22 and an extension part 231 extending from the connection part 231. The connection part 231 is interposed between the heat dissipation member 3 and the capacitor element 21. The extension part 232 is connected to a later-described metal plate 14. The bus bar 23 is mainly made of a copper plate.

The capacitor 2 includes a moisture resistant member 24. The moisture resistant member 24 covers the capacitor element 21 and the electrode part 22, and covers part of the connection part 231. The principal surface S1 of the connection part 231 on the side of the heat dissipation member 3 is exposed from the moisture resistant member 24. The principal surface S1 is pressed against the heat dissipation member 3. The moisture resistant member 24 is made of synthetic resin such as epoxy resin.

The connection part 231 covers the principal surface S2 of the electrode part 22. The moisture resistant member 24 covers a side surface S3 of the capacitor element 21 and a side surface S4 of the electrode part 22, and part of a side surface S5 of the connection part 231.

The principal surface S2 of the electrode part 22 is not exposed from the connection part 231. In this embodiment, the principal surface S2 of the electrode part 22 is entirely covered by the connection part 231. Since the electrode part 22 is a metalicon electrode, and accordingly micropores are present in the electrode part 22, moisture can easily pass through the electrode part 22. If moisture enters the capacitor element 21, there is a concern that electrostatic capacity may decrease since the metal layer 211 (see FIG. 6) of the capacitor element 21 is oxidized. Therefore, in this embodiment, the side surface S3 of the capacitor element 21 and the side surface S4 of the electrode part 22 are covered by the moisture resistant member 24, and the principal surface S2 of the electrode part 22 is covered by the connection part 231. Accordingly, external moisture can be prevented from entering the electrode part 22 and the capacitor element 21

The connection part 231 is pressed against the heat dissipation member 3 so that the connection part 231 serves also as a cooling plate. That is, in this embodiment, the connection part 231 functions as a cooling plate for cooling the capacitor element 21, a waterproofing plate for preventing external moisture from entering, and a connector for connecting the capacitor element 21 to other components.

As shown in FIGS. 2 and 3, the two electrode parts 22a and 22b of the capacitor 2 are formed in both ends in the X-direction of the capacitor element 21. The electrode parts 22a and 22b are connected to the connection parts 231 (231a and 231b) of the bus bar 23, respectively. The connection parts 231a and 231b are cooled by the heat dissipation members 3.

In this embodiment, each heat dissipation member 3 is a cooling tube 3a formed with a flow channel 12 thereinside through which coolant 11 flows. The cooling tube 3a is made of metal. An insulation member 6 made of ceramic is interposed between the cooling tube 3a and the connection part 231.

As shown in FIG. 1, the power conversion apparatus 1 includes semiconductor modules $5_S$ and a reactor $5_L$ (which may be collectively referred to as the electronic components 5 hereinafter). The capacitors 2a and 2b are connected with the reactor $5_L$ and the semiconductor module $5_S$ through the metal plate 14 so as to constitute a voltage step-up circuit 100 (see FIG. 7) and an inverter circuit 101.

The semiconductor module $5_S$, the reactor $5_L$, the capacitors 2a and 2b and the cooling tubes 3a are stacked in the X-direction as a stacked body 10. The stacked body 10 is housed in a case 13. The pressing member 4 is interposed between a first wall part 131 of the case 13 and the stacked body 10. This pressing member 4 presses the stacked body 10 against a second wall part 132 of the case 13. Accordingly, a sufficient contact pressure can be ensured between the capacitors 2 and the cooling tubes 3a and between the electronic components 5 and the cooling tubes 3a, while fixing the stacked body 10 to the inside of the case 13.

As shown in FIG. 1, each two cooling tubes 3a which are adjacent to each other in the X-direction are coupled to each other by a pair of coupling tubes 17. The coupling tubes 17 are provided in both ends of the cooling tube 3a in the width direction (Y-direction) which is perpendicular to both the projecting direction (Z-direction) of power terminals 52p and 52n (may be collectively referred to as the power terminals 52 hereinafter) and the X-direction. Some of the cooling tubes 3a are provided with an inlet tube 15 for introducing the coolant 11 and an outlet tube 16 for discharging the coolant 11. The coolant 11 introduced from the inlet tube 15 flows through all the coupling tubes 17 to cool the capacitors 2 (2a and 2b) and the electronic components 5 ($5_S$ and $5_L$), and exits from the outlet tube 16.

Figure 5:
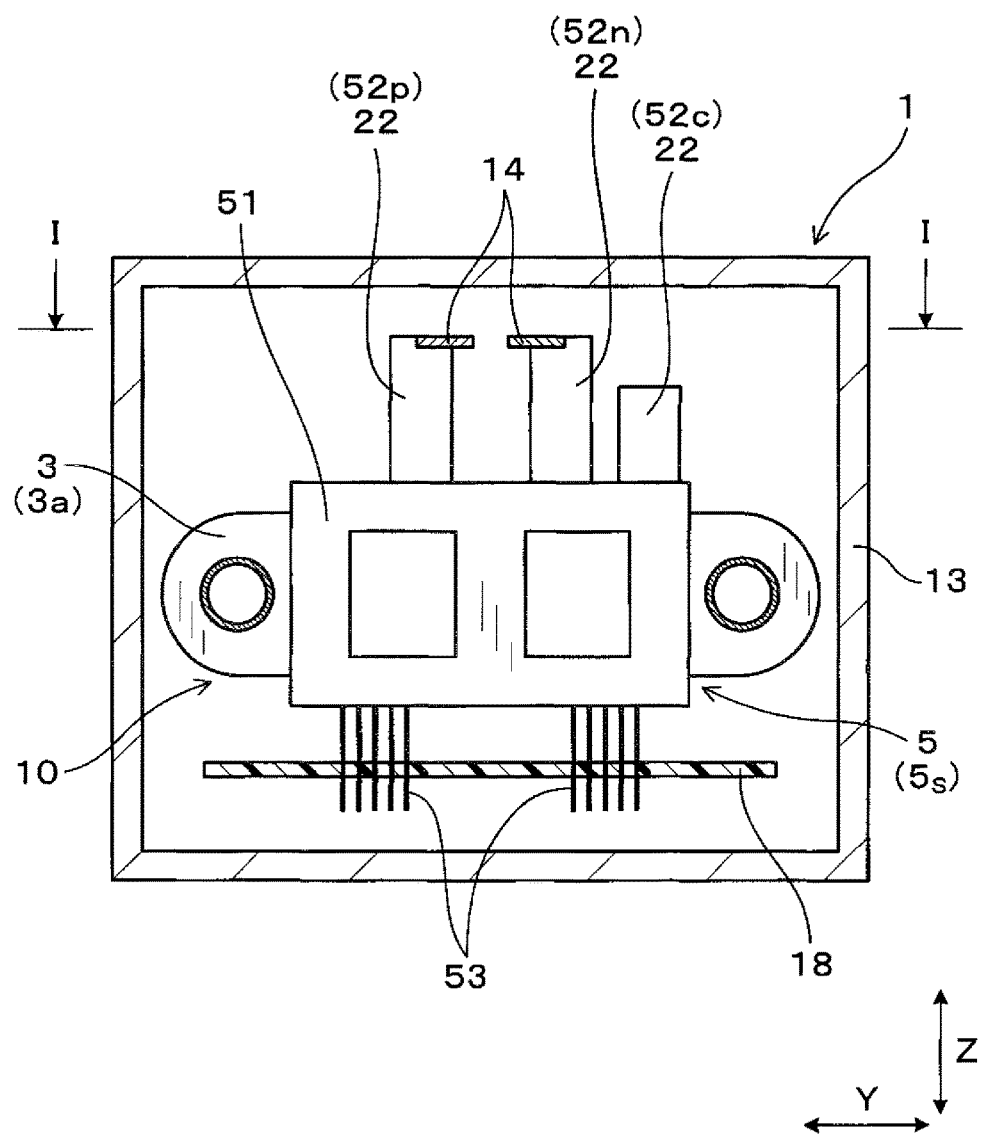
FIG. 5 is a cross-sectional view of FIG. 1 taken along line V-V.

As shown in FIG. 5, each semiconductor module $5_S$ includes a main body 51 incorporating a semiconductor element 50 (see FIG. 7), the power terminals 52 projecting from the main body 51, and control terminals 53. The power terminals 52 include positive and negative terminals 52p and 52n between which a DC voltage is applied, and an AC terminal 52c to which an AC load 81 (see FIG. 7) is connected. The control terminals 53 are connected to a control circuit board 18 which controls switching of the semiconductor elements 50.

Figure 7:
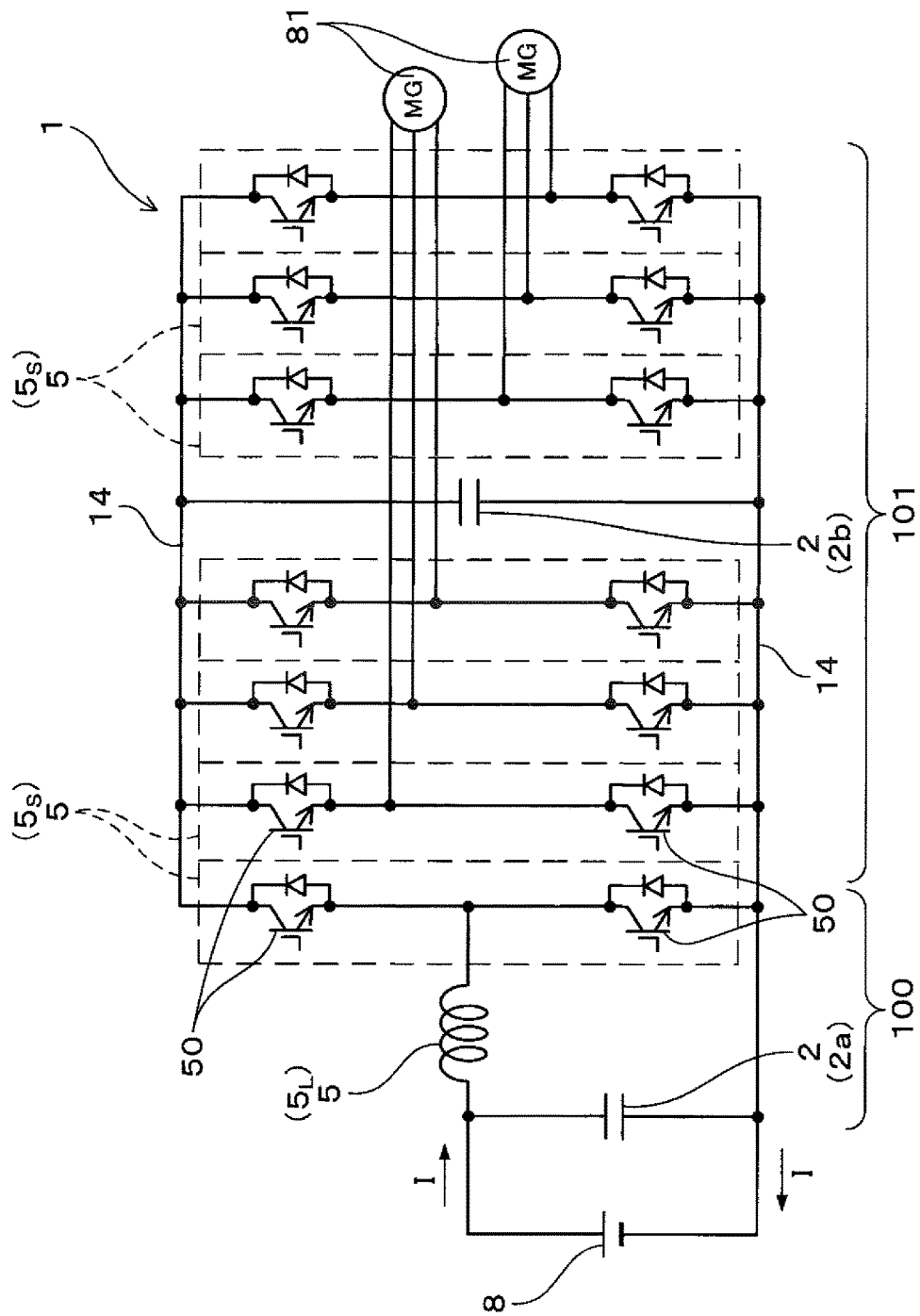
FIG. 7 is a circuit diagram of the power conversion apparatus according to the first embodiment.

As shown in FIG. 7, the voltage step-up circuit 100 is constituted of the filter capacitor 2a, the reactor $5_L$ and some of the semiconductor modules $5_S$, while the inverter circuit 101 is constituted of the other semiconductors $5_S$ and the smoothing capacitor 2b. In this embodiment, the DC voltage of a DC power supply 8 is stepped up by the voltage step-up circuit 100, and then converted into an AC voltage (AC power) by the inverter circuit 101. The AC load 81 (a three-phase AC motor in this embodiment) is driven by the AC power supplied from the inverter circuit 101 to run the vehicle. The filter capacitor 2a removes any noise current contained in a current I supplied from the DC power supply 8. The smoothing capacitor 2b smooths the DC voltage stepped up by the voltage step-up circuit 100.

The advantages provided by the above described embodiment are explained below. In this embodiment, as shown in FIGS. 2 and 3, part of each bus bar 23 is interposed in the X-direction between the heat dissipation member 3 and the capacitor element 21. The capacitors 2 and the heat dissipation members 3 are pressed in the X-direction. This makes it possible to increase the efficiency of cooling of the capacitor elements 21. This is because, since part of each bus bar 23 can be pressed against the heat dissipation member 3, the bus bar 23 can be cooled efficiently by the heat dissipation member 3. As described in the foregoing, the capacitor element 21 includes the dielectric body 210 and the metal layer 211 formed on the surface of the dielectric body 210, and mainly the metal layer 211 generates heat. Since the metal layer 211 is connected to the electrode parts 22 which are connected with the bus bars 23, it is possible to efficiently transfer the heat generated by the metal layer 211 to the bus bars 23 through the electrode parts 22 by cooling the bus bars 23. Accordingly, since the dielectric body 210 of the capacitor element 21 does not interfere with the heat transfer, it is possible to cool the capacitor element 21 efficiently.

In this embodiment, the connection part 231 of the bus bar 23, which is interposed between the capacitor element 21 and the heat dissipation member 3 is made flat at its principal surface S1 on the side of the heat dissipation member 3. Accordingly, since gaps are hardly formed between the connection part 231 and the heat dissipation member 3, the connection part 231 can be cooled efficiently. Hence, the efficiency of cooling of the capacitor element 21 can be increased. Further, since the pressing force applied to the connection part 231 can be made uniform, it is possible to prevent the capacitor element 21 from being applied locally with a large pressing force.

Figure 8:
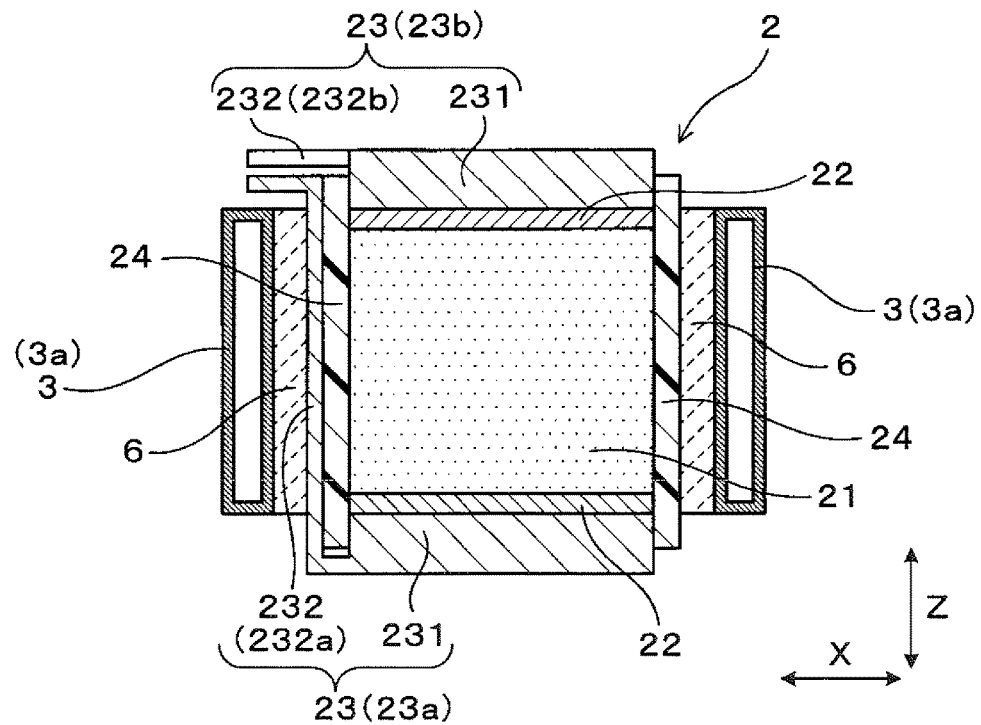
FIG. 8 is an enlarged cross-sectional view of a main part of a power conversion apparatus according to a second embodiment of the invention.

In this embodiment, the connection part 231 of the bus bar 23 is interposed between the heat dissipation member 3 and the capacitor element 21. This makes it possible to further increase the efficiency of cooling of the capacitor 2. It may be possible to interpose the extension part 232 of the bus bar 23 between the heat dissipation member 3a and the capacitor element 21 as shown in FIG. 8. However, in this case, since the heat transfer distance between the extension part 232 and the capacitor element 21 becomes long, there is a concern that the efficiency of cooling of the capacitor 2 may be lowered. Accordingly, in this embodiment, the connection part 231 of the bus bar 23 is interposed between the heat dissipation member 3 and the capacitor element 21 as shown in FIGS. 2 and 3, so that the heat transfer distance between the extension part 232 and the capacitor element 21 is small to further increase the efficiency of cooling of the capacitor element 21.

As shown in FIGS. 2 and 3, the principal surface S1 of the connection part 231 on the side of the heat dissipation member 3 is exposed from the moisture resistant member 24. Accordingly, since the moisture resistant member 24 is not present between the heat dissipation member 3 and the connection part 231, the connection part 231 can be cooled efficiently. Therefore, the efficiency of cooling of the capacitor element can be increased. Further, the length in the X-direction of the capacitor 2 can be reduced.

The side surface S3 of the capacitor element 21 and the side surface S4 of each electrode part 22 are covered by the moisture resistant member 24. The principal surface S2 of the electrode part 22 is covered by the connection part 231. Accordingly, external moisture can be prevented from entering the electrode part 22 and the capacitor element 21 by the moisture resistant member 24 and the connection part 231. Therefore, it is possible to prevent the capacitor 2 from being reduced in electrostatic capacity. In addition, since it is not necessary to cover the principal surface S2 of the electrode part 22 by the moisture resistant member 24, the usage amount of the moisture resistant member 24 can be reduced, and accordingly the capacitor 2 can be made compact in size.

Figure 16:
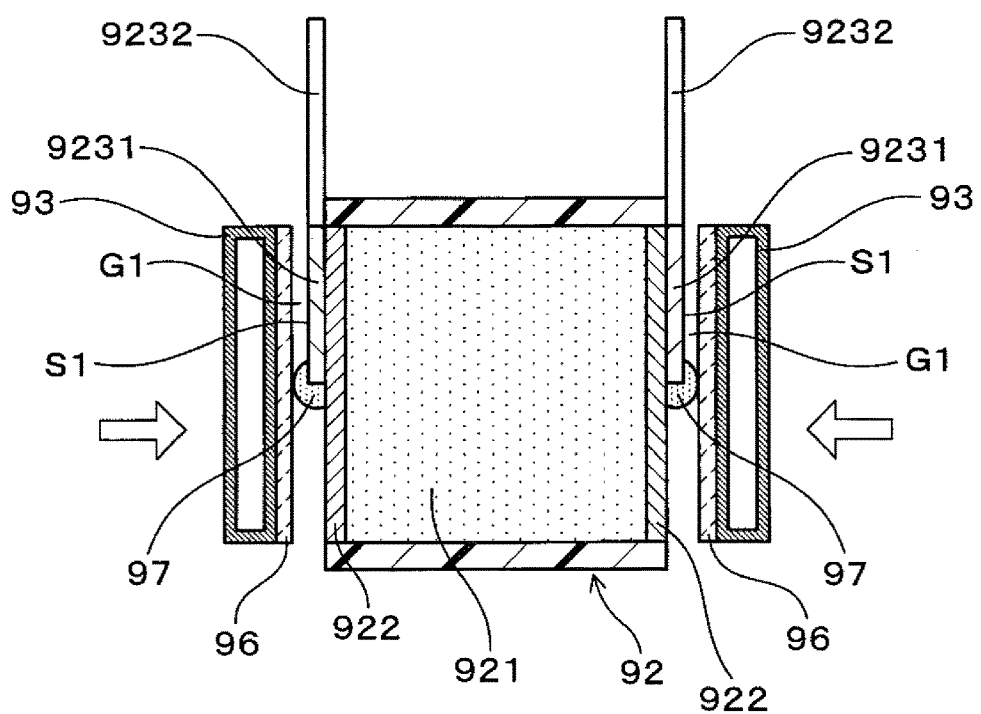
FIG. 16 is a cross-sectional view of a capacitor and heat dissipation members of a power conversion apparatus of a comparative example.

Between the connection part 231 and the electrode part 22, there is present an adhesion member 7 such as solder to adhere them to each other. The adhesion member 7 is provided so as not to cover the principal surface S1 of the connection part 231. As shown in FIG. 16, if an adhesion member 97 covers part of the principal surface S1 of a connection part 9231, since a gap G is formed between an insulating member 96 and the connection part 9231, it is difficult to sufficiently cool the connection part 9231. In this embodiment, since the adhesion member 7 does not cover the principal surface S1 of the connection part 231, the connection part 231 and the insulating member 6 can be stuck to each other, and accordingly the connection part 231 can be cooled efficiently. Hence, the efficiency of cooling of the capacitor element 21 can be increased.

As shown in FIG. 1, the electronic components 5 ($5_S$, $5_L$), the capacitors 2 and the cooling tubes 3a are stacked in the X-direction as the stacked body 10. The capacitors 2 are electrically connected to the electronic components 5. Accordingly, the efficiency of cooling of the capacitor elements 2 can be further increased. That is, according to this structure, it is possible to block the heat transfer from the electronic components 5 to the capacitor elements 2 through space. In addition, the heat transferring from the electronic components 5 to the capacitor element 21 through the metal plate 14 can be removed by the cooling tubes 3a. Therefore, it is possible to effectively suppress the heat transfer from the electronic components 5 to the capacitor element 21.

As shown in FIGS. 2 and 3, both the two connection parts 231 (231a, 231b) of each capacitor 2 are cooled by the cooling tubes 3a. Accordingly, the efficiency of cooling of the capacitor element 21 can be further increased.

As shown in FIG. 2, the thickness of the connection part 231 is made larger than that of the extension part 232. This makes it possible to cover a part near the electrode part 22 of the side surface S5 with the moisture resistant member 24, while exposing the extension part 232 from a part distant from the electrode part 22 of the side surface S5. Accordingly, it is possible to prevent moisture from entering from the side surface S5 of the connection part 231.

As explained above, according to the above described embodiment, there is provided a power conversion apparatus which is high in the efficiency of cooling of the capacitor elements thereof.

Second Embodiment

Next, a second embodiment of the invention is described. The second embodiment differs from the first embodiment in the structure of the capacitor 2. As shown in FIG. 8, in the second embodiment, of the two bus bars 23a and 23b, an extension part 232a of the bus bar 23a is disposed adjacent to the moisture resistant member 24. This extension part 232a is interposed in the X-direction between the heat dissipation member 3 (cooling tube 3a) and the capacitor element 21. Other than the above, the second embodiment is the same in structure and advantage as the first embodiment.

Third Embodiment

Figure 9:
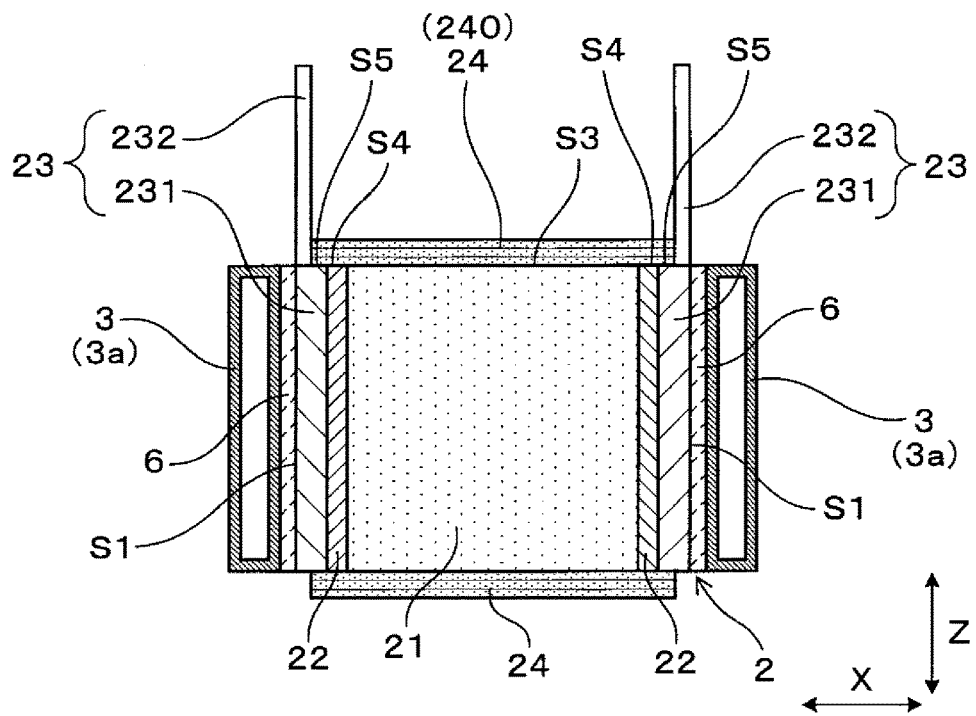
FIG. 9 is a cross-sectional view of a capacitor and heat dissipation members of a power conversion apparatus according to a third embodiment of the invention.

Next, a third embodiment of the invention is described. The third embodiment differs from the first embodiment in the structure of the moisture resistant member 24. As shown in FIG. 9, in the third embodiment, the moisture resistant member 24 is formed by winding a moisture resistant film 240 in a coil. The moisture resistant film 240 covers the side surface S3 of the capacitor element 21, the side surface S4 of the electrode part 22 and part of the side surface S5 of the connection part 231.

According to this embodiment, since the moisture resistant member 24 is formed by winding the moisture resistant film 240 in a coil, it is easy to reduce the thickness of the moisture resistant member 24 compared to cases where a pre-formed body made of resin is used as the moisture resistant member 24. Therefore, according to the third embodiment, the capacitor 2 can be made further compact in size. Other than the above, the third embodiment is the same in structure and advantage as the first embodiment.

Fourth Embodiment

Figure 10:
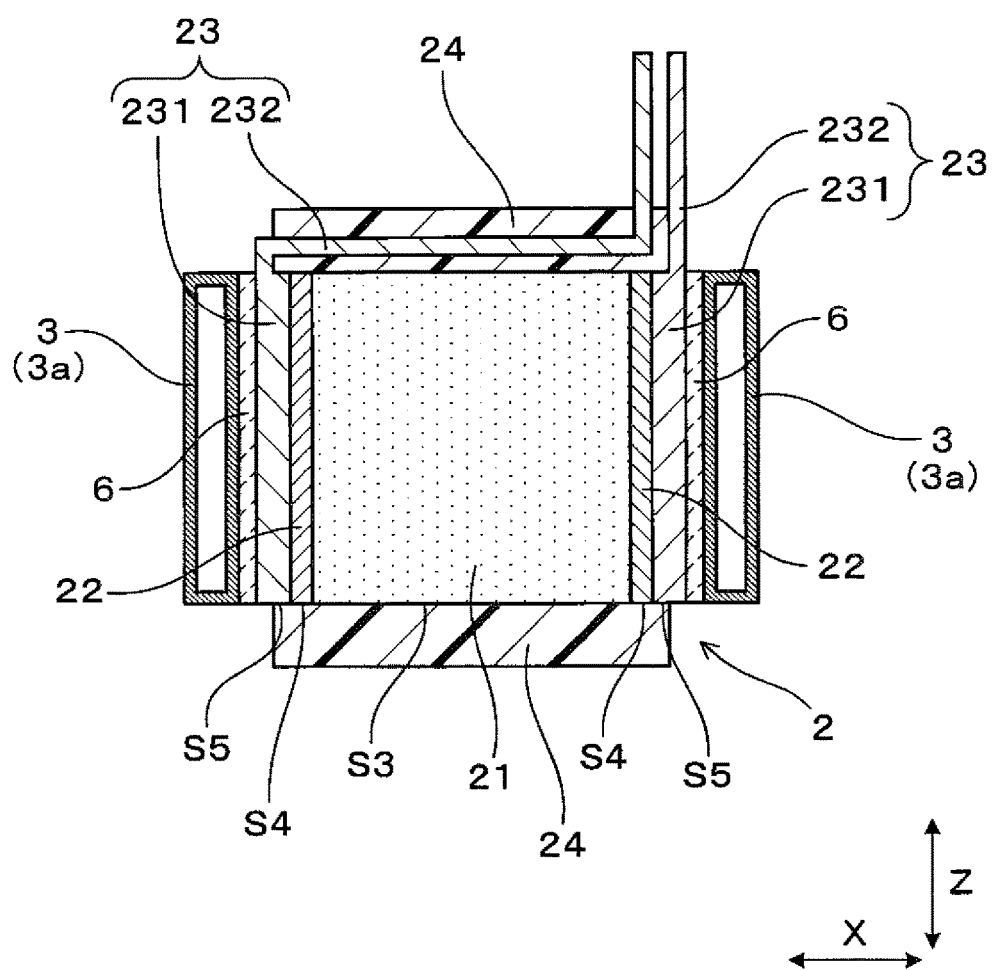
FIG. 10 is a cross-sectional view of a capacitor and heat dissipation members of a power conversion apparatus according to a fourth embodiment of the invention.

Next, a fourth embodiment of the invention is described. The fourth embodiment differs from the first embodiment in the structure of the moisture resistant member 24. As shown in FIG. 10, in the fourth embodiment, the moisture resistant member 24 covers the side surface S3 of the capacitor element 21, the side surface S4 of the electrode part 22 and the side surface S5 of the connection part 231, and seals part of the extension part 232. The moisture resistant member 24 is formed of a pre-formed body made of resin.

In this embodiment, since the extension part 232 is sealed by the moisture resistant member 24, it is possible to insulate the extension part 232 from other members. Other than the above, the fourth embodiment is the same in structure and advantage as the first embodiment.

Fifth Embodiment

Figure 11:
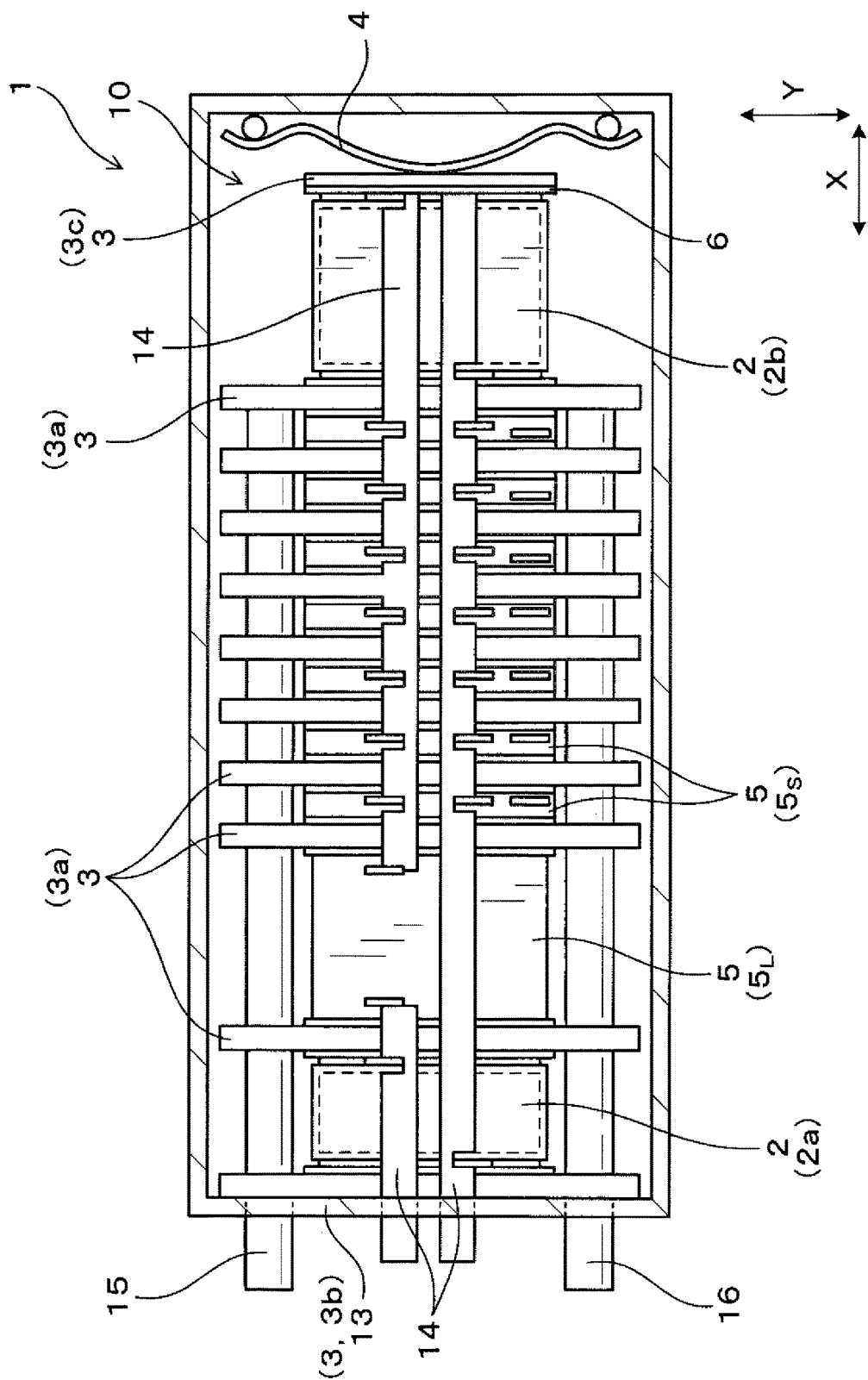
FIG. 11 is a cross-sectional view of a power conversion apparatus according to a fifth embodiment of the invention.

Next, a fifth embodiment of the invention is described. The fifth embodiment differs from the first embodiment in the number of the cooling tubes 3a. As shown in FIG. 11, in the fifth embodiment, the filter capacitor 2a is disposed between the case 13 made of metal and the cooling tubes 3a. One of the connection parts (231a, see FIG. 2) of the filter capacitor 2a is cooled by the case 13. The other connection part 231b is cooled by the cooling tube 3a. That is, in this embodiment, the case 13 is used as the heat dissipation member 3.

The smoothing capacitor 2b is interposed between the cooling tubes 3a and a heat sink 3c. One of the connection parts (231a, see FIG. 2) is cooled by the cooling tube 3a. The other connection part 231b is cooled by the heat sink 3c. The heat sink 3c is applied with the pressing force of the pressing member 4. The heat sink 3c uniforms the pressing force of the pressing member 4 to prevent the smoothing capacitor 2b from being locally applied with the pressing force to thereby prevent it from being dented. As described above, in this embodiment, the heat sink 3c functions as the heat dissipation member 3 for cooling the smoothing capacitor 2b, and also functions as a member for uniforming the pressing force of the pressing member 4.

According to this embodiment, since the number of the cooling tubes 3a can be reduced, the manufacturing cost of the power conversion apparatus 1 can be reduced. In addition, since the length in the X-direction of the power conversion apparatus 1 can be reduced, the power conversion apparatus can be made compact in size. Other than the above, the fifth embodiment is the same in structure and advantage as the first embodiment.

Sixth Embodiment

Figure 12:
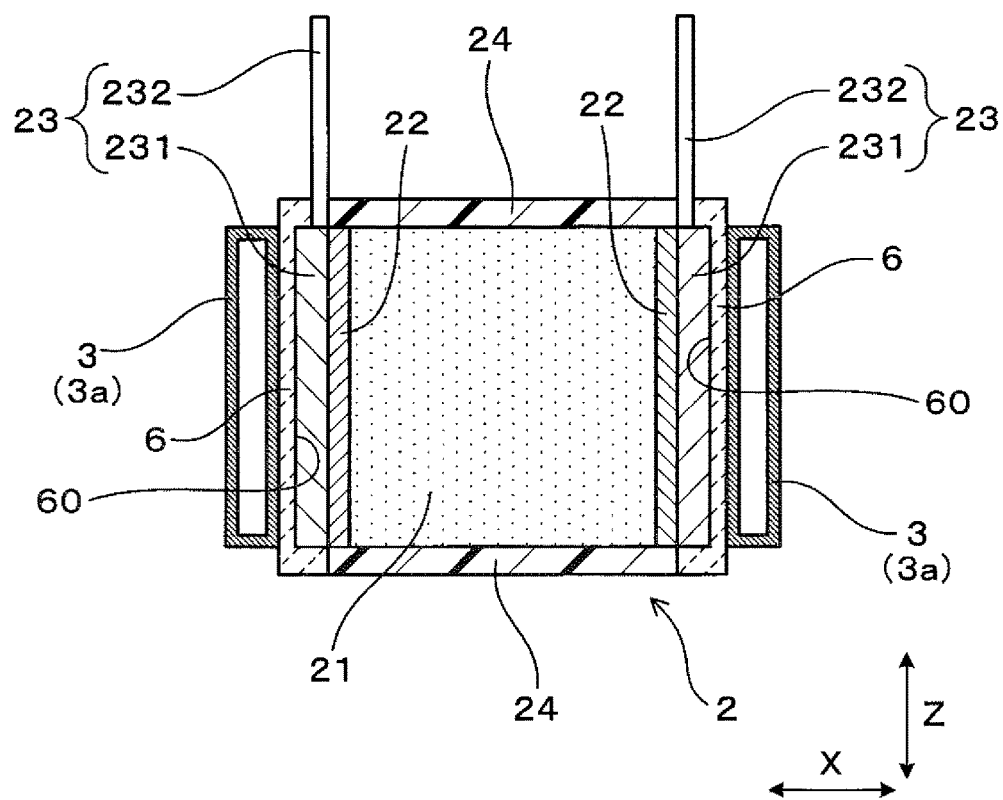
FIG. 12 is a cross-sectional view of a capacitor and heat dissipation members of a power conversion apparatus according to a sixth embodiment of the invention.

Next, a sixth embodiment of the invention is described. The sixth embodiment differs from the first embodiment in the shape of the insulation member 6. In this embodiment, as shown in FIG. 12, the insulation member 6 is formed with recesses 60 denting in the direction from the capacitor 2 to the cooling tube 3a. The connection parts 231 of the bus bar 23 are fit in these recesses 60.

According to this embodiment, since the creepage distance between the bus bar 23 and the cooling tube 3a can be reduced, it is easy to insulate the bus bar 23 from the cooling tube 3a. Other than the above, the sixth embodiment is the same in structure and advantage as the first embodiment.

Seventh Embodiment

Figure 13:
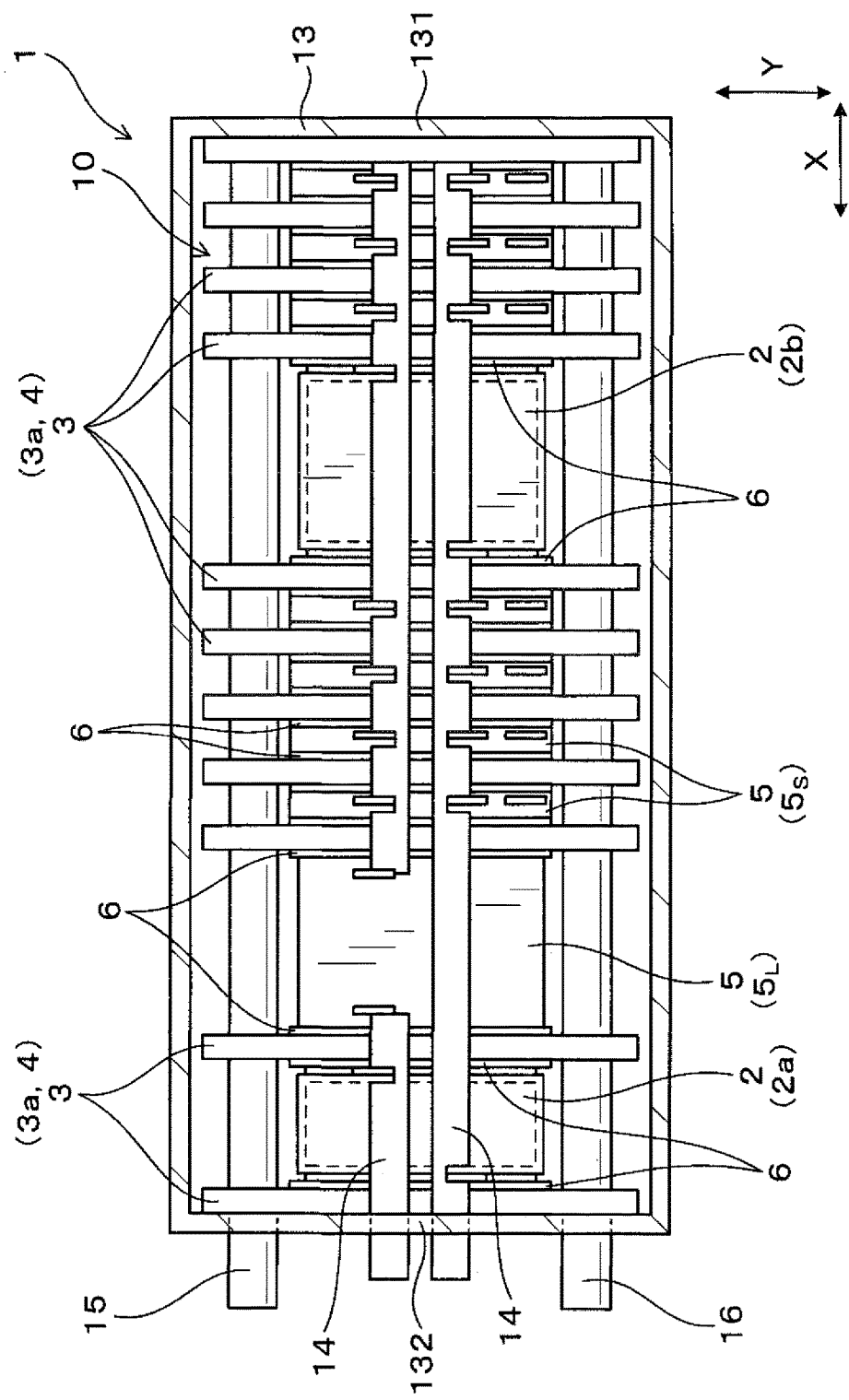
FIG. 13 is a cross-sectional view of a power conversion apparatus according to a seventh embodiment of the invention.

Next, a seventh embodiment of the invention is described. The seventh embodiment differs from the first embodiment in the structure of the pressing member 4. In this embodiment, as shown in FIG. 13, the stacked body 10 is housed in the case 13 in a state where the stacked body 10 is compressed in the X-direction and the cooling tubes 3a are resiliently deformed in the x-direction. The stacked body 10 is sandwiched between the wall parts 131 and 132 of the case 13. The capacitor 2 and the cooling tubes 3a are pressed in the X-direction by the resilient return force of the cooling tubes 3a. According to this embodiment, since the pressing member 4 is not needed, the length in the X-direction of the power conversion apparatus 1 can be reduced, and accordingly the power conversion apparatus 1 can be made compact in size. Further, since the parts count of the power conversion apparatus 1 can be reduced, the manufacturing cost of the power conversion apparatus 1 can be reduced.

In this embodiment, as in the first embodiment, the insulation member 6 is interposed between the capacitor 2 and the cooling tube 3a, and between the electronic component 5 and the cooling tube 3a. The insulation member 6 is made of resilient material. While the power conversion apparatus 1 is in operation, since the capacitors 2 and the electronic components 5 generate heat, the capacitors 2 and the electronic components 5 expand with heat. In this embodiment, when there occurs a force in the X-direction due to thermal expansion of the capacitors 2 and the electronic components 5, this force is absorbed by the insulation members 6.

In the case where the pressing member 4 is provided as is the case with the first embodiment, the force in the X-direction occurring due to thermal expansion of the capacitors 2 and so on can be absorbed sufficiently by the pressing member 4. However, in the case where the pressing member 4 is not provided and the cooling tubes 3 double as the pressing member 4 as is the case with this embodiment, such a force may not be sufficiently absorbed by the cooling tubes 3a. Accordingly, in this embodiment, such a force is absorbed by the insulation members 6. Other than the above, the seventh embodiment is the same in structure and advantage as the first embodiment.

Eighth Embodiment

Figure 14:
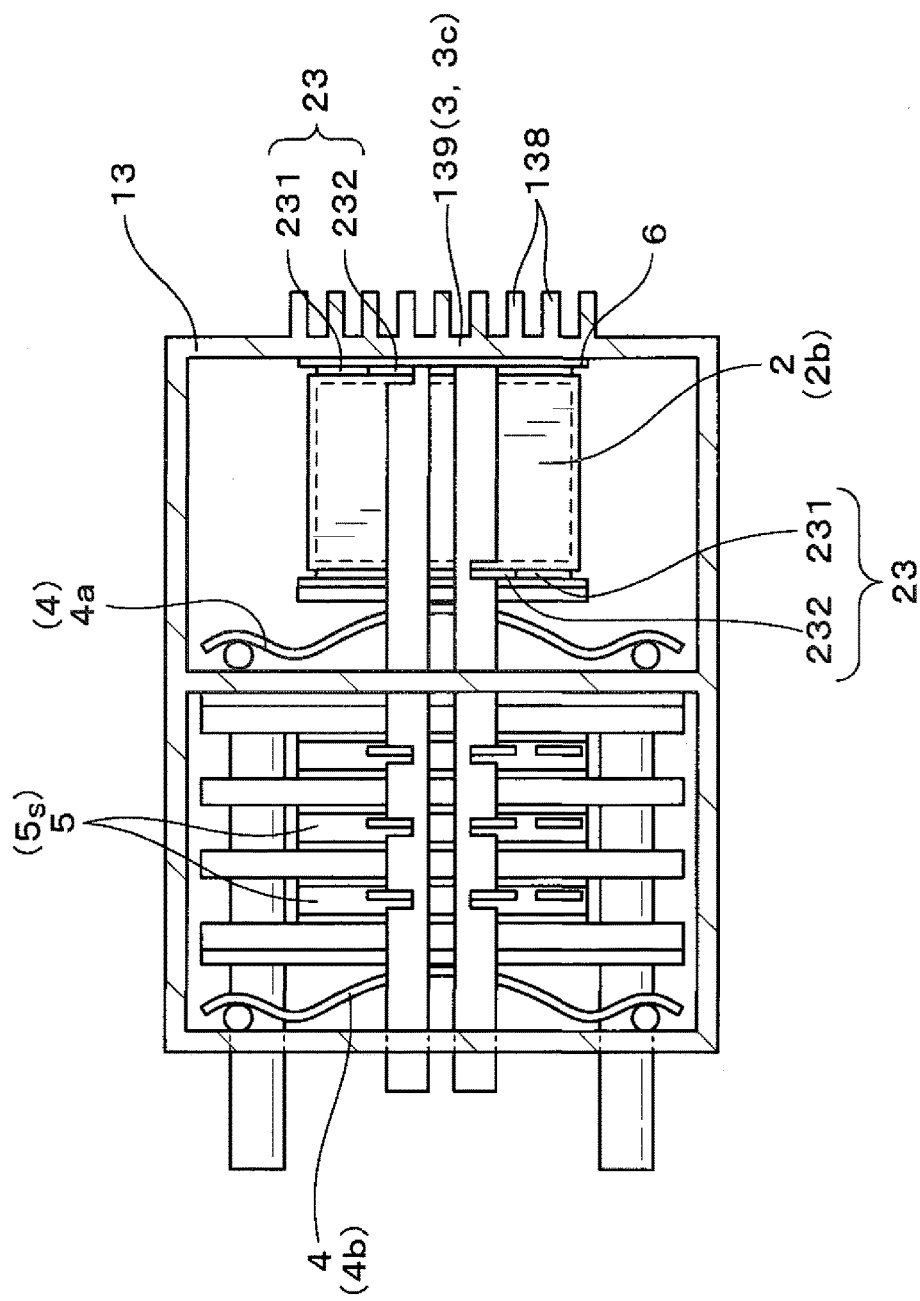
FIG. 14 is a cross-sectional view of a power conversion apparatus according to an eighth embodiment of the invention.

Next, an eighth embodiment of the invention is described. The eighth embodiment differs from the first embodiment in the structure of the heat dissipation member 3. In this embodiment, as shown in FIG. 14, the capacitor 2 is pressed against a wall part 139 of the case 13 made of metal. The wall part 139 serves as the heat sink 3c provided with heat dissipation projections 138. In this embodiment, the wall part 139 is used as the heat dissipation member 3. Other than the above, the eighth embodiment is the same in structure and advantage as the first embodiment.

Ninth Embodiment

Figure 15:
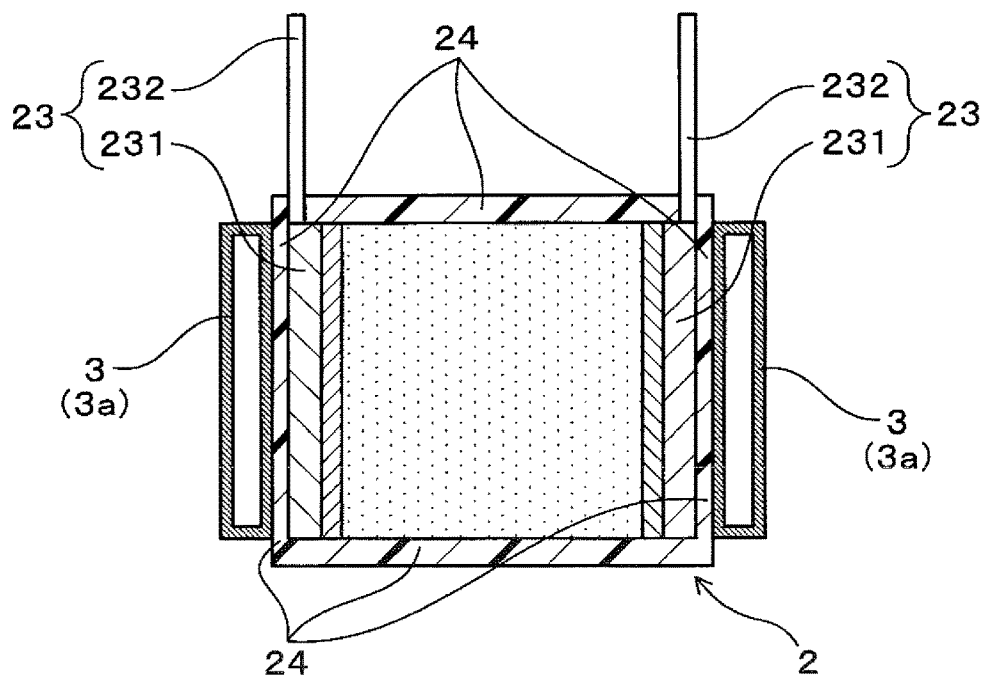
FIG. 15 is a cross-sectional view of a capacitor and heat dissipation members of a power conversion apparatus according to a ninth embodiment of the invention.

Next, a ninth embodiment of the invention is described. The ninth embodiment differs from the first embodiment in the structure of the moisture resistant member 24. In this embodiment, as shown in FIG. 15, the connection parts 231 are entirely covered by the moisture resistant member 24, and the insulation member 6 is not provided between the capacitor 2 and the cooling tube 3a.

In this embodiment, the connection parts 231 can be insulated from the cooling tubes 3a by the moisture resistant member 24. Accordingly, since the insulation member 6 is not needed, the manufacturing cost of the power conversion apparatus 1 can be reduced. Other than the above, the ninth embodiment is the same in structure and advantage as the first embodiment.

The above explained preferred embodiments are exemplary of the invention of the present application which is described solely by the claims appended below. It should be understood that modifications of the preferred embodiments may be made as would occur to one of skill in the art.

What is claimed is:

1. A power conversion apparatus comprising:
    a capacitor including:
        a capacitor element including:
            a dielectric body; and
            a metal layer formed on a surface of the dielectric body;
        an electrode part connected to the metal layer; and
        a bus bar connected to the electrode part; and
    a heat dissipation member for cooling the capacitor, wherein
    the heat dissipation member has a narrow face and a broad face broader than its narrow face,
    the broad face of the heat dissipation member is arranged to face the electrode part,
    the electrode part has a narrow face and a broad face broader than its narrow face, and
    the broad face of the heat dissipation member is arranged to face the broad face of the electrode part.

2. The power conversion apparatus according to claim 1, wherein a part of the bus bar is interposed between the broad face of the heat dissipation member and the capacitor element.

3. The power conversion apparatus according to claim 2, wherein the capacitor and the heat dissipation member are pressed in an arranging direction in which the capacitor and the heat dissipation member are arranged.

4. The power conversion apparatus according to claim 1, wherein the capacitor and the heat dissipation member are pressed in an arranging direction in which the capacitor and the heat dissipation member are arranged.

* * * * *